(12) United States Patent
Mylavarapu et al.

(10) Patent No.: US 12,061,518 B2
(45) Date of Patent: *Aug. 13, 2024

(54) PARITY DATA IN DYNAMIC RANDOM ACCESS MEMORY (DRAM)

(71) Applicant: Micron Technology, Inc., Boise, ID (US)

(72) Inventors: Sai Krishna Mylavarapu, Folsom, CA (US); Todd A. Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/108,876

(22) Filed: Feb. 13, 2023

(65) Prior Publication Data

US 2023/0185660 A1 Jun. 15, 2023

Related U.S. Application Data

(63) Continuation of application No. 17/130,885, filed on Dec. 22, 2020, now Pat. No. 11,579,964.

(51) Int. Cl.
*G06F 11/10* (2006.01)
*G11C 11/00* (2006.01)
*G11C 11/4074* (2006.01)
*G11C 11/4096* (2006.01)

(52) U.S. Cl.
CPC ...... *G06F 11/1004* (2013.01); *G06F 11/1068* (2013.01); *G11C 11/005* (2013.01); *G11C 11/4074* (2013.01); *G11C 11/4096* (2013.01)

(58) Field of Classification Search
CPC ............. G06F 11/1004; G06F 11/1012; G06F 11/1048; G06F 11/1068; G11C 11/005; G11C 29/028; G11C 29/42; G11C 29/52
See application file for complete search history.

(56) References Cited

U.S. PATENT DOCUMENTS

| | | | |
|---|---|---|---|
| 8,041,989 B2 | 10/2011 | Lastras-Montano et al. | |
| 8,086,783 B2 | 12/2011 | O'Connor et al. | |
| 10,459,793 B2 | 10/2019 | Bandic et al. | |
| 10,606,692 B2 | 3/2020 | Coteus et al. | |
| 2015/0248329 A1 | 9/2015 | Kang et al. | |
| 2016/0162359 A1* | 6/2016 | Kittner | G06F 3/0619 714/764 |
| 2018/0024897 A1 | 1/2018 | Cai et al. | |
| 2018/0129600 A1 | 5/2018 | Ishiyama et al. | |
| 2019/0065306 A1* | 2/2019 | Margetts | G06F 11/1068 |
| 2021/0055985 A1* | 2/2021 | Lee | G11C 29/028 |
| 2021/0374003 A1 | 12/2021 | Helmick et al. | |
| 2022/0108762 A1* | 4/2022 | Jang | G11C 7/1057 |

* cited by examiner

*Primary Examiner* — Shelly A Chase
(74) *Attorney, Agent, or Firm* — Brooks, Cameron & Huebsch, PLLC

(57) ABSTRACT

Methods, devices, and systems related to storing parity data in dynamic random access memory (DRAM) are described. In an example, a method can include generating, at a controller, parity data based on user data queued for writing to a non-volatile memory device, receiving the parity data at a DRAM device from the controller and writing the parity data to the DRAM device, receiving the user data at a non-volatile memory device from the controller and writing the user data to the non-volatile memory device, reading the user data from the non-volatile memory device via the controller, and receiving the parity data at the controller from the DRAM device.

18 Claims, 3 Drawing Sheets

PARITY DATA IN DYNAMIC RANDOM ACCESS MEMORY (DRAM)

PRIORITY INFORMATION

This application is a Continuation of U.S. application Ser. No. 17/130,885, filed Dec. 22, 2020, which issues as U.S. Pat. No. 11,579,964 on Feb. 14, 2023, the contents of which are included herein by reference.

TECHNICAL FIELD

The present disclosure relates generally to managing parity data in dynamic random access memory (DRAM).

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), DRAM, and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory module (e.g., a dual in-line memory module (DIMM)) used in computing devices. Memory modules can include volatile, such as DRAM, for example, and/or non-volatile memory, such as Flash memory or RRAM, for example. The DIMMs can be used as main memory in computing systems.

DETAILED DESCRIPTION

Figure 1:
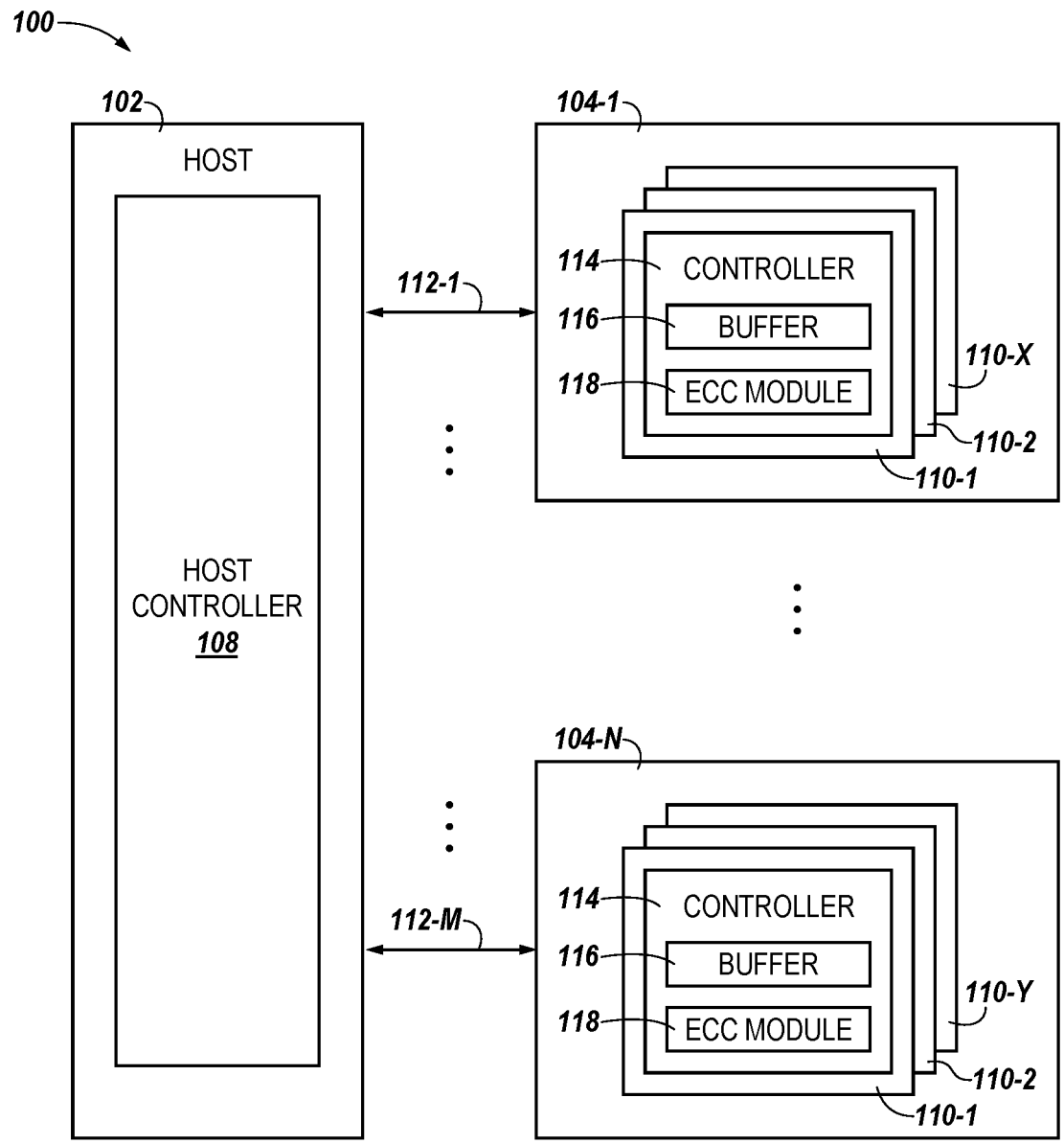
FIG. 1 is a block diagram of an apparatus in the form of a computing system including a memory system in accordance with a number of embodiments of the present disclosure.

The present disclosure includes methods, apparatuses, and systems related to generating, at a controller, parity data based on user data queued for writing to a non-volatile memory device coupled to the controller, receiving the parity data at a DRAM device from the controller and writing the parity data to the DRAM device, receiving the user data at the non-volatile memory device from the controller and writing the user data to the non-volatile memory device, reading the user data from the non-volatile memory device via the controller, and receiving the parity data at the controller from the DRAM device.

The non-volatile memory device and/or the DRAM can be included in a DIMM. The DIMM can be a non-volatile dual in-line memory module (NVDIMM). In a number of embodiments, the non-volatile memory device can be a 3D Cross-point device or a NAND device.

The non-volatile memory device can provide near DRAM speeds with non-volatility, which can eliminate substantial system overhead such as periodic checkpointing and/or dropping system state to a hard drive and/or SSD. The non-volatile memory device also can provide a large memory capacity, for example 1 terabyte (TB), of main memory. In some examples, the memory capacity of the non-volatile memory device can be used for in-memory databases.

In a number of embodiments, non-volatile memory, for instance, 3D Cross-point can have a high defectivity and in some circumstances cannot tolerate a die fail. Die failure can be absorbed using XOR and/or RAID methods. These methods can include one or more dice solely storing parity data of user data written on other dice and responsive to a die fail an XOR operation can be performed with the parity data to restore the user data. However, writing the parity data to one or more dice and/or reconstructing the user data responsive to a die fail can reduce write performance and/or read performance.

A non-volatile memory device coupled to a DRAM device can absorb a die failure without reducing the write performance and/or the read performance of a system. An independent DRAM module to store parity data allows for the full memory bandwidth of the non-volatile memory device to go to serving high performance writes, for example. In a number of embodiments, the non-volatile memory device and the DRAM device can be included in a relatively small footprint.

The controller including an error correction code (ECC) module can generate the parity data by performing an error correction code operation, for example an XOR and/or RAID operation, on the user data. The parity data can be stored in (e.g., written to) the DRAM device and/or in the non-volatile memory device with the user data. In some examples, the parity data can be embedded in the user data in the non-volatile memory device. In a number of embodiments, a bit stream that comprises the user data can also comprise one or more bits of parity data.

User data stored in the non-volatile memory device can be reconstructed using the parity data. The controller can receive (e.g., read) the parity data from the DRAM device and reconstruct the user data in response to a read failure. The read failure can be due to corrupted memory in the non-volatile memory device. In some examples the controller can read and reconstruct the user data in one clock cycle since the parity data is readily available at the DRAM device. For example, when user data is read from the non-volatile memory device, the corresponding parity data is also read from the DRAM device so that if there is a read error, the parity data is readily available and an ECC operation can be executed in one clock cycle.

In a number of embodiments, the parity data can be stored in the non-volatile memory device prior to powering off the DRAM device and/or the DIMM. The parity data can be rewritten to the DRAM device in response to powering on the DRAM device. In some examples, the parity data can be regenerated at the controller and/or received at the DRAM device in response to powering off and powering on the DRAM device. For example, the controller can receive the user data from the non-volatile memory device and perform an XOR operation on the user data in response to powering on the DRAM device and/or the DIMM.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "M", "N", "X", and "Y" indicates that a number of the particular feature so designated can be included with a number of embodiments of the present disclosure.

As used herein, "a number of" something can refer to one or more of such things. For example, a number of DIMMs can refer to one or more DIMMs. Additionally, designators such as "M", "N", "X", and "Y", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a functional block diagram of a computing system 100 including an apparatus in the form of a number of memory systems 104-1 . . . 104-N, in accordance with one or more embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

In the embodiment illustrated in FIG. 1, memory systems 104-1 . . . 104-N can include a one or more dual in-line memory modules (DIMM) 110-1, . . . , 110-X, 110-Y. The DIMMs 110-1, . . . , 110-X, 110-Y can include volatile memory and/or non-volatile memory. In a number of embodiments, memory systems 104-1, . . . , 104-N can include a multi-chip device. A multi-chip device can include a number of different memory types and/or memory modules. For example, a memory system can include non-volatile or volatile memory on any type of a module.

In FIG. 1, memory system 104-1 is coupled to the host via channel 112-1 can include DIMMs 110-1, . . . , 110-X, where DIMM 110-1 is a NVDIMM and 110-X is DRAM DIMM. In this example, each DIMM 110-1, . . . , 110-X, 110-Y includes a controller 114. Controller 114 can receive commands from host 102 and control execution of the commands on a DIMM. Also, in a number of embodiments, the protocol of the present disclosure could be implemented by a memory device (e.g., a DIMM) without a controller and execution of the commands using the protocol of the present disclosure could be built into the memory device.

The host 102 can send commands to the DIMMs 110-1, . . . , 110-X, 110-Y using the protocol of the present disclosure and/or a prior protocol, depending on the type of memory in the DIMM. For example, the host can use the protocol of the present disclosure to communicate on the same channel (e.g., channel 112-1) with a NVDIMM and a prior protocol to communicate with a DRAM DIMM that are both on the same memory system. The host and the NVDIMM can communicate via read ready (R_RDY) signals, read send (R_SEND) signals, write credit increment (WC_INC) signals, and read identification (RID) signals according the protocol of the present disclosure. The read ready (R_RDY) signals, read send (R_SEND) signals, write credit increment (WC_INC) signals, and read identification (RID) signals can be sent via pins that are unused in a prior protocol (e.g. DDR4) or are pins from a prior protocol (e.g. DDR4) that are repurposed (e.g. used differently) so that the present protocol is compatible with the prior protocol. Also, pins can be assigned to the read ready (R_RDY) signals, read send (R_SEND) signals, write credit increment (WC_INC) signals, and read identification (RID) signals in protocols that are being developed (e.g., DDR5).

As illustrated in FIG. 1, a host 102 can be coupled to the memory systems 104-1 . . . 104-N. In a number of embodiments, each memory system 104-1 . . . 104-N can be coupled to host 102 via a channel. In FIG. 1, memory system 104-1 is coupled to host 102 via channel 112-1 and memory system 104-N is coupled to host 102 via channel 112-N. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory systems 104-1 . . . 104-N. The host controller 108 can send commands to the DIMMs 110-1, . . . , 110-X, 110-Y via channels 112-1 . . . 112-N. The host controller 108 can communicate with the DIMMs 110-1, . . . , 110-X, 110-Y and/or the controller 114 on each of the DIMMs 110-1, . . . , 110-X, 110-Y to read, write, and erase data, among other operations. A physical host interface can provide an interface for passing control, address, data, and other signals between the memory systems 104-1 . . . 104-N and host 102 having compatible receptors for the physical host interface. The signals can be communicated between 102 and DIMMs 110-1, . . . , 110-X, 110-Y on a number of buses, such as a data bus and/or an address bus, for example, via channels 112-1 . . . 112-N.

The host controller 108 and/or controller 114 on a DIMM can include control circuitry, e.g., hardware, firmware, and/or software. In one or more embodiments, the host controller 108 and/or controller 114 can be an application specific integrated circuit (ASIC) coupled to a printed circuit board including a physical interface. Also, each DIMM 110-1, . . . , 110-X, 110-Y can include buffers 116 of volatile and/or non-volatile memory and an ECC module 118. Buffer 116 can be used to buffer data that is used during execution of read commands and/or write commands. An ECC operation can be performed on data by the ECC module 118 to correct errors prior to being stored in the buffer 116, for example.

The DIMMs 110-1, . . . , 110-X, 110-Y can provide main memory for the memory system or could be used as additional memory or storage throughout the memory system. Each DIMM 110-1, . . . , 110-X, 110-Y can include one or more arrays of memory cells, e.g., non-volatile memory cells. The arrays can be flash arrays with a NAND architecture, for example. Embodiments are not limited to a particular type of memory device. For instance, the memory device can include RAM, ROM, DRAM, SDRAM, PCRAM, RRAM, and flash memory, among others.

The embodiment of FIG. 1 can include additional circuitry that is not illustrated so as not to obscure embodiments of the present disclosure. For example, the memory systems 104-1 . . . 104-N can include address circuitry to latch address signals provided over I/O connections through I/O circuitry. Address signals can be received and decoded by a row decoder and a column decoder to access the DIMMs 110-1, . . . , 110-X, 110-Y. It will be appreciated by those skilled in the art that the number of address input connections can depend on the density and architecture of the DIMMs 110-1, . . . , 110-X, 110-Y.

Figure 2:
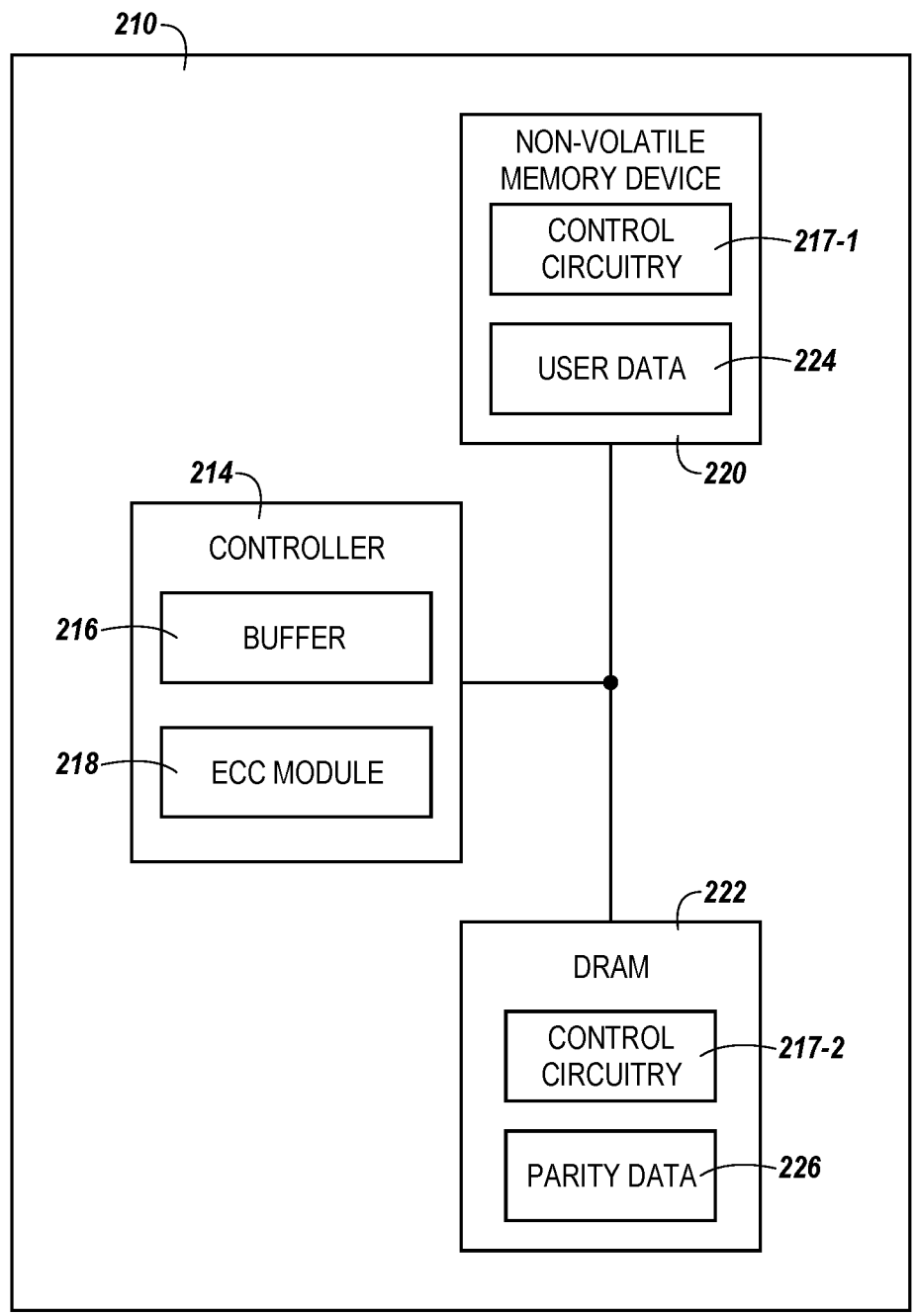
FIG. 2 is a block diagram of an apparatus in the form of a dual in-line memory modules (DIMM) in accordance with a number of embodiments of the present disclosure.

FIG. 2 is a block diagram of an apparatus in the form of a dual in-line memory modules (DIMM) 210 in accordance with a number of embodiments of the present disclosure. DIMM 210 can correspond to DIMMs 110-1, . . . , 110-X, 110-Y in FIG. 1. In FIG. 2, DIMM 210 can include a controller 214. Controller 214 can correspond to controller 114 in FIG. 1. Controller 214 can include memory, such as SRAM memory, that can be a buffer 216 and/or an ECC module 218. Buffer 216 and ECC module 218 can correspond to buffer 116 and ECC module 118 in FIG. 1, respectively. DIMM 210 can include a non-volatile memory device 220 and a DRAM device 222 coupled to the controller 214.

Non-volatile memory device 220 can include non-volatile memory arrays. In some examples, the non-volatile memory device 220 can be a 3D Cross-point device or a NAND device. The non-volatile memory device 220 can provide near DRAM speeds with non-volatility, which can eliminate substantial system overhead such as periodic checkpointing and/or dropping system state to a hard drive and/or SSD. The non-volatile memory device 220 also can provide a large memory capacity, for example 1 TB, of main memory. In some examples, the memory capacity of the non-volatile memory device 220 can be used for in-memory databases.

In a number of embodiments, non-volatile memory, for instance, 3D Cross-point can have a high defectivity and in some circumstances cannot tolerate a die fail. Die failure can be absorbed using XOR and/or RAID methods. These methods can include one or more dice solely holding parity data of user data written on other dice and responsive to a die fail an XOR operation can be performed with the parity data to restore the user data. However, writing the parity data to one or more dice and/or reconstructing the user data responsive to a die fail can reduce write performance and/or read performance.

DIMM 210 including the non-volatile memory device 220 and the DRAM device 222 can absorb a die failure without reducing the write performance and/or the read performance of the DIMM 210. The DIMM 210 including an independent DRAM device 222 to store the parity data 226 allows for the full memory bandwidth of the non-volatile memory device 220 to go to serving high performance writes, for example. In a number of embodiments, the non-volatile memory device 220 and the DRAM device 222 can be included in a relatively small footprint.

The non-volatile memory device 220 can include control circuitry 217-1 (e.g., hardware, firmware, and/or software) which can be used to execute commands on non-volatile memory device 220. The control circuitry 217-1 can receive commands from controller 214. The control circuitry 217-1 can be configured to execute commands to read and/or write data in non-volatile memory device 220.

In a number of embodiments, user data 224 can be stored on non-volatile memory device 220. The non-volatile memory device 220 can be configured to read the user data 224 in response to receiving a read command from controller 214 and/or a host (e.g., host 102 in FIG. 1).

DRAM device 222 can include control circuitry 217-2 to execute commands on DRAM device 222. The control circuitry 217-2 can receive commands from controller 214 and/or the host and can execute commands to read and/or write data in DRAM device 222.

The controller 214 including the ECC module 218 can generate the parity data 226 by performing an error correction code operation, for example an XOR and/or RAID operation, on the user data 224. The parity data 226 can be stored in the DRAM device 222 and/or in the non-volatile memory device 220 with the user data 224. In some examples, the parity data 226 can be embedded in the user data 224 in the non-volatile memory device 220. In a number of embodiments, a bit stream that comprises the user data 224 can also comprise one or more bits of the parity data 226.

User data 224 stored in the non-volatile memory device 220 can be reconstructed using the parity data 226. The non-volatile memory device 220 can transmit the user data 224 to the controller 214 in response to receiving a read command from the host device. The controller 214 can receive the parity data 226 from the DRAM device 222 and reconstruct the user data 224 in response to a read failure (e.g., an error during a read operation of the user data 224 from the non-volatile memory device 220). The read failure can be due to corrupted memory in the non-volatile memory device 220. The controller 214 can reconstruct the user data 224 by performing an ECC operation on the parity data 226 using the ECC module 218. The controller 214 can send the user data 224 to the host device and/or the non-volatile memory device 220 in response to reconstructing the user data 224.

In some examples the controller 214 can read and/or reconstruct the user data 224 in one clock cycle since the parity data 226 is readily available in the DRAM device 222. For example, when user data 224 is read from the non-volatile memory device 220, the corresponding parity data 226 is also read from the DRAM device 222 so that if there is a read error, the parity data 226 is readily available and an ECC operation can be executed in one clock cycle. Reading and/or reconstructing the user data 224 in one clock cycle can increase performance, decrease power consumption and/or decrease processing time of the DIMM 210.

In a number of embodiments, the parity data 226 can be stored in the non-volatile memory device 220 prior to powering off the DRAM device 222 and/or the DIMM 210. The parity data 226 can be rewritten to the DRAM device 222 in response to powering on the DRAM device 222. In some examples, the parity data 226 can be regenerated at the controller 214 and/or received at the DRAM device 222 in response to powering off and powering on the DRAM device 222. For example, the controller 214 can receive the user data 224 from the non-volatile memory device and perform an ECC operation, for example an XOR operation, on the user data 224 using the ECC module 218 to regenerate the parity data 226 in response to powering on the DRAM device 222 and/or the DIMM 210.

Figure 3:
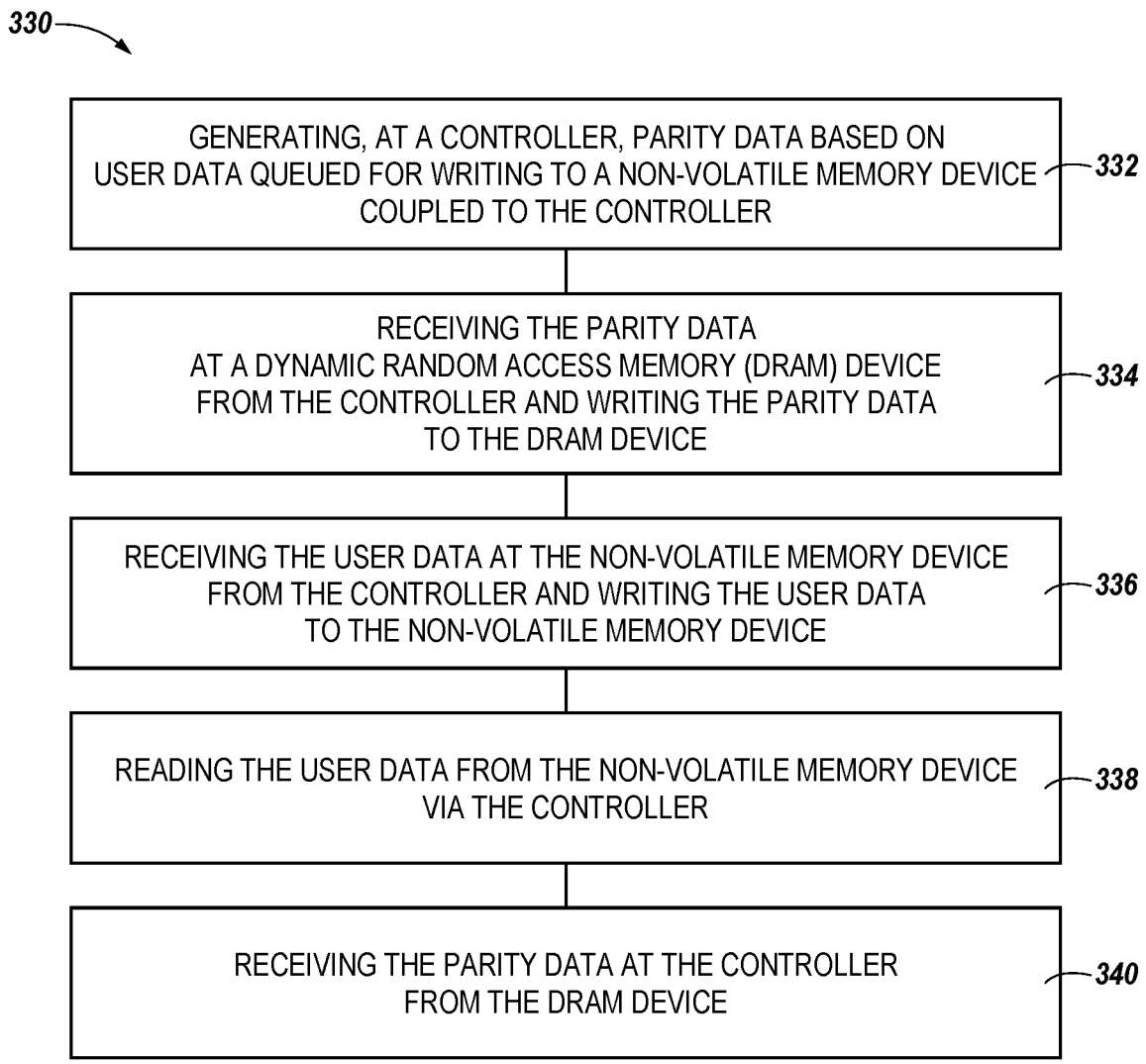
FIG. 3 is a flow diagram of a method for storing parity data in DRAM in accordance with a number of embodiments of the present disclosure.

FIG. 3 is a flow diagram of a method 330 for storing parity data in DRAM in accordance with a number of embodiments of the present disclosure. At block 332, the method 330 can include generating, at a controller, parity data based on user data queued (e.g., scheduled) for writing to a non-volatile memory device coupled to the controller. The controller including an ECC module can generate the parity data by performing an error correction code operation, for example an XOR and/or RAID operation, on the user data.

At block 334, the method 330 can include receiving the parity data at a DRAM device from the controller and writing the parity data to the DRAM device. The parity data can be stored in the DRAM device and/or in the non-volatile memory device with the user data. In some examples, the parity data can be embedded in the user data in the non-volatile memory device.

At block 336, the method 330 can include receiving the user data at the non-volatile memory device from the controller and writing the user data to the non-volatile memory device. The non-volatile memory device can be a 3D Cross-point device or a NAND device. The non-volatile memory device can be included in a DIMM. In some examples, the DIMM can be a NVDIMM.

At block 338, the method 330 can include reading the user data from the non-volatile memory device via the controller. The non-volatile memory device can transmit the user data to the controller in response to receiving a read command, for example. While executing the read command, a read failure may occur. For example, a read failure may occur due to corrupted memory in the non-volatile memory device.

At block 340, the method 330 can include receiving the parity data at the controller from the DRAM device. The controller can receive the parity data from the DRAM device and reconstruct the user data in response to the read failure. The controller can reconstruct the user data by performing an ECC operation on the parity data using the ECC module. In some examples the controller can read and reconstruct the user data in one clock cycle. For example, when user data is read from the non-volatile memory device, the corresponding parity data is also read from the DRAM device so that if there is a read error, the parity data is readily available and an ECC operation can be executed in one clock cycle. The controller can send the user data to the non-volatile memory device and/or a host device in response to reconstructing the user data.

In a number of embodiments, method 330 can further include storing the parity data in the non-volatile memory device prior to powering off the DRAM device and/or the DIMM. The parity data can be rewritten to the DRAM device in response to powering on the DRAM device. In some examples, the parity data can be regenerated at the controller and/or received at the DRAM device in response to powering off and powering on the DRAM device. For example, the controller can receive the user data from the non-volatile memory device and perform an ECC operation, for example an XOR operation, on the user data using the ECC module to regenerate the parity data in response to powering on the DRAM device and/or the DIMM.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
receiving user data from a non-volatile memory device at a controller;
receiving parity data corresponding to the user data from a dynamic random access memory (DRAM) device at the controller;
reconstructing the user data in one clock cycle at the controller; and
regenerating the parity data in response to powering off and powering on the DRAM device.

2. The method of claim 1, further comprising receiving the parity data and reconstructing the user data in response to a read failure.

3. The method of claim 2, further comprising receiving the parity data and reconstructing the user data in response to the read failure, wherein the read failure is due to corrupted memory in the non-volatile memory device.

4. The method of claim 1, further comprising reading the user data and reconstructing the user data in one clock cycle.

5. The method of claim 1, further comprising generating the parity data at the controller by performing an error correction code (ECC) operation on the user data.

6. The method of claim 1, further comprising performing a RAID operation on the user data to generate the parity data at the controller.

7. An apparatus, comprising:
a dynamic random access memory (DRAM) device;
a non-volatile memory device coupled to the DRAM device, wherein the non-volatile memory device is configured to store user data; and
a controller coupled to the DRAM device and the non-volatile memory device, wherein the controller is configured to:
receive the user data from the non-volatile memory device; and
perform an ECC operation on the user data to regenerate parity data in response to powering on the DRAM device.

8. The apparatus of claim 7, wherein the controller comprises an error correction code (ECC) module configured to perform the ECC operation.

9. The apparatus of claim 7, wherein the ECC operation is an XOR operation.

10. The apparatus of claim 7, wherein the controller is configured to perform the ECC operation in one clock cycle.

11. The apparatus of claim 7, wherein the controller is configured to rewrite the parity data to the DRAM device in response to powering on the DRAM device.

12. The apparatus of claim 7, wherein the controller is configured to regenerate the parity data in response to powering off and powering on the DRAM device.

13. The apparatus of claim 7, wherein the apparatus is a non-volatile dual in-line memory module (NVDIMM).

14. An apparatus, comprising:
a controller configured to generate parity data based on user data;
a dynamic random access memory (DRAM) device configured to store the parity data; and
a non-volatile memory device configured to:
store the user data; and
store the parity data prior to powering off the DRAM device; and
wherein the controller is configured to rewrite the parity data to the DRAM device in response to powering on the DRAM device.

15. The apparatus of claim 14, wherein the non-volatile memory device is a 3D Cross-point device.

16. The apparatus of claim 14, wherein the controller is configured to generate the parity data based on the user data in response to receiving a write command.

17. The apparatus of claim 16, wherein the write command includes the user data.

18. The apparatus of claim 14, wherein the controller is configured to generate the parity data based on the user data, wherein the user data is queued for writing to the non-volatile memory device.

* * * * *